United States Patent [19]
Woodward

[11] Patent Number: 5,389,776
[45] Date of Patent: Feb. 14, 1995

[54] FET-BASED OPTICAL RECEIVER

[75] Inventor: Ted K. Woodward, Lincroft, N.J.

[73] Assignee: AT&T Corp., Murray Hill, N.J.

[21] Appl. No.: 156,137

[22] Filed: Nov. 22, 1993

[51] Int. Cl.$^6$ .............................................. H01J 40/14
[52] U.S. Cl. ............................... 250/214 LS; 250/551
[58] Field of Search .............. 250/214 R, 214 LS, 551; 307/311

[56] References Cited
U.S. PATENT DOCUMENTS

| | | | |
|---|---|---|---|
| 4,647,794 | 3/1987 | Guajardo | 307/311 |
| 5,256,882 | 10/1993 | Miyasaka | 250/551 |
| 5,329,115 | 7/1994 | Lim | 250/214 R |

OTHER PUBLICATIONS

D'Asaro, L. A., Chirovsky, L. M. F., Laskowski, E. J., Pei, S. S., Woodward, T. K., Lentine, A. L., Leibenguth, R. E., Focht, M. W., Freund, J. M., Guth, G. G., and Smith, L. E., "Batch Fobrication and Operation of GaAs–Al$_x$Ga$_{1-x}$ As Field–Effect Transistor–Self–Electrooptic Effect Device (FET-SEED) Smart Pixel Arrays," IEEE Journal of Quantum Electronics, vol. 29, No. 2, Feb. 1993, pp. 670–677.

D'Asaro, L. A., Chirovsky, L. M. F., Laskowski, E. J., Pei, S. S., Leibenguth, R. E., Woodward, T. K., Focht, M., Lentine, A. L., Asom, M. T., Guth, G., Kopf, R. F., Kuo, J. M., Pearton, S. J., Przybylek, G. J., Ren, F., and Smith, L. E., "Batch Fabrication and Structure of Integrated GaAs–Al$_x$Ga$_{1-x}$ As Field–Effect Transistor–Self–Electro–optic Effect Devices (FET-SEED's)," IEEE Electron Device Letters, vol. 13, No. 10, Oct. 1992, pp. 528–531.

Goodman, Joseph W., Leonberger, Frederick I., Kung, Sun–Yuan, and Athale, Ravindra A., "Optical Interconnections for VLSI Systems," Proceedings of the IEEE, vol. 72, No. 7, Jul. 1984, pp. 159–175.

Lentine, A. L., Chirovsky, L. M. F., and Woodward, T. K., "Optical Energy Considerations for Diode–Clamped Smart Pixel Optical Receivers," AT&T Technical Memorandum, Apr. 15, 1993.

Woodward, T. K., Lentine, A. L., Chirovsky, L. M. F., Pei, S. S., Freund, J. M., D'Asaro, Focht, M. F., Laskowski, E. J., Guth, G. D., and Smith, L. E., "Operating Characteristics of GaAs/AlGaAs FET-SEED Smart Pixels," IEEE, 1992, pp. 26.4.1–26.4.4.

Woodward, T. K., Chirovsky, L. M. F., Lentine, A. L., D'Asaro, L. A., Laskowski, E. J., Focht, M., Guth, G., Pei, S. S., Ren, M. T., Kopf, R. F., Kuo, J. M., and Feuer, M. D., "Operation of a Fully Integrated GaAs–Al$_x$Ga$_{1-x}$ As FET-SEED: A Basic Optically Addressed Integrated Circuit," IEEE Photonics Technology Letters, vol. 4, No. 6, Jun. 1992, pp. 614–617.

*Primary Examiner*—Edward P. Westin
*Assistant Examiner*—Stephone B. Allen

[57] ABSTRACT

A complementary field-effect transistor (CFET) receiver apparatus and method for receiving optical signals and for generating output signals is disclosed. In particular, four input beams, two of which are unique, are utilized to turn two series-connected FETs on and off to generate the output signals. A CFET photoreceiver according to the invention operates in push-pull fashion to conserve electrical power, and can be realized as a monolithically integrated device using FET-SEED fabrication techniques.

18 Claims, 5 Drawing Sheets

FET-BASED OPTICAL RECEIVER

TECHNICAL FIELD

This invention relates to an optoelectronic apparatus and method for receiving optical signals. In particular, the present invention relates to a field-effect transistor optical receiver which operates in a push-pull fashion.

BACKGROUND OF THE INVENTION

As photonics becomes more widely used in communications equipment, the performance characteristics of optoelectronic circuit elements must be improved. There are several prior art optical receiver circuit designs in existence. Such circuits receive optical input beams and generate output signals which take the form of either electrical signals or regenerated optical signals.

One prior art design is an optoelectric receiver circuit which is a field-effect transistor (FET) implementation of a high impedance receiver. Another prior art approach involves utilizing an FET implementation of a transimpedance receiver. Both the high input impedance receiver and the transimpedance receiver have some serious disadvantages. For example, when single light beams are used, a resistor is often employed in these prior art receivers, and this resistor fixes the bandwidth of the receiver. Further, because there is always some static current flow through the FETs of these receiver designs, electrical energy is dissipated or wasted. Yet further, since only one input beam is used, the power level of that beam must be of sufficient intensity so that the receiver can distinguish between logic states. In addition, a passive pull-up load causes a slow down in output switching.

SUMMARY OF THE INVENTION

These disadvantages are overcome by apparatus according to the present invention. In particular, a first exemplary embodiment of the present invention is a complementary field-effect transistor (CFET) optical receiver having first and second photo-diodes connected in series in a loop having a first node between them, and third and fourth photo-diodes connected in series having a second node between them. First and second field-effect transistors (FETs) are connected together in series, and the gate of the first FET is connected to the first node while the gate of the second FET is connected to the second node. The output of the CFET optical receiver is taken from a third node between the first and second FETs.

During operation, the CFET receiver utilizes four input light beams, two of which are unique. A first input beam is duplicated into two beams which are simultaneously incident on the first and fourth photo-diodes, and a complementary input beam is duplicated into two beams which are incident on the second and third photo-diodes. The first and complementary input beams are alternately incident on the photo-diodes such that while one transistor is being turned off, the other is being turned on. This push-pull operation results in a greatly reduced static current flow in the CFET receiver as compared to prior art optical receivers. Thus, the CFET receiver decreases electrical power consumption.

The CFET receiver additionally has the advantage of being insensitive to the absolute power used in the input beams with respect to generating output data. Rather, an output is generated based on the difference in power between the two optical input beams that fall on the optical detectors at any one time, and thus the speed of the receiver circuit is directly proportional to the difference in power between them.

Another embodiment of the CFET receiver has an amplifier stage. The amplifier stage comprises two FETs connected in series, and provides additional gain to the input signal so that lower energy optical input signals can be utilized. In addition, a clamping section can be connected to the CFET receiver to bias the optical detectors. The clamping section restricts the voltage swing of the optical detectors to be within a predetermined range, and permits the optical detectors to be biased to arbitrary reverse biases, which may be desirable in some cases.

Further, a photo-receiver according to the embodiments of the present invention can be realized as a monolithically integrated device. An advantage of the CFET optical receiver is that the electrical characteristics of the two FETs may be made the same. Thus, for example, the CFET receiver could be fabricated using GaAs multiple quantum well (MQW) modulators as the optical detectors, in combination with two depletion-mode GaAs FETs using a monolithic integration technology.

Further features and advantages of the present invention are readily apparent to those of skill in the art in view of the following detailed description when taken in connection with the accompanying drawings.

DETAILED DESCRIPTION

Figure 1:
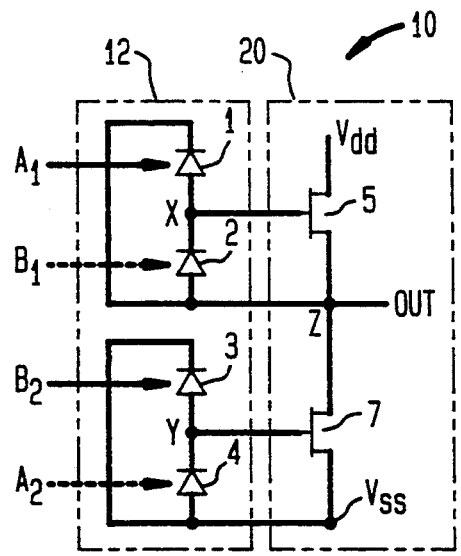
FIG. 1 is a circuit diagram of a complementary-mode field-effect transistor (CFET) apparatus according to the present invention.

FIG. 1 is a circuit diagram of a complementary field-effect transistor (CFET) optical receiver 10 according to the present invention. The CFET receiver 10 has a detector section 12 comprising photo-diodes 1, 2, 3 and 4, and an input section 20 comprising two field effect transistors (FETs) 5 and 7. Photo-diodes 1 and 2 are connected in series in a loop and have an electrical node X between them, and photo-diodes 3 and 4 are connected in series in a loop and have an electrical node Y between them. The electrical node X is connected to the gate input of FET 5, and the electrical node Y is connected to the gate input of FET 7. The FETs 5 and 7 are connected in series, are biased between a drain voltage $V_{dd}$ and a source voltage $V_{ss}$, and have a node Z between them. The output of the CFET receiver 10 is taken at the electrical node Z. In one embodiment, the voltage sources of the CFET receiver 10 may suitably be as follows: Vdd=2.0 volts and Vss=−1.0 to −1.5 volts.

The photo-diodes, 1, 2, 3 and 4 operate to convert light to current. In general, each photo-diode generates a current proportional to the power in the optical beam incident upon it, with a polarity that tends to forward bias the diode. A potential difference is therefore developed across each diode such that the forward-biased diode current is exactly balanced by the photocurrent. In magnitude, this potential is comparable to the built-in voltage ($V_{bi}$) of the photo-diode. Thus, for example, when a light beam $A_1$ is incident on the photo-diode 1 of the CFET receiver 10 shown in FIG. 1, the potential developed at node X is positive with respect to node Z, which tends to turn on FET 5. Conversely, when the light beam $A_1$ is off and a light beam $B_1$ is incident on the photo-diode 2, the potential developed at node X is negative with respect to node Z, which tends to turn off FET 5.

In one mode of operation of the CFET receiver 10, two differential optical data streams are incident on the four photo-diodes 1, 2, 3 and 4. The use of differential optical data increases system tolerance to non-uniformities which may occur, for example, power level variations across arrays of receivers. In this example, both beams have a time varying intensity corresponding to the signal one wishes to detect. Thus, a digital "1" is carried by a first input beam which is bright while a second input beam is dark, and a digital "0" is carried by the second input beam which is bright while the first input beam is dark. This data is supplied to the four detectors of the CFET receiver 10 by duplicating the first and second input beams into two sets, shown as dotted arrows $A_1$, $A_2$ and $B_1$, $B_2$ in FIG. 1. A beam splitter, diffraction grating or other means could be used to duplicate the first and second input beams. Such beam splitting apparatus and methods are known, and thus will not be discussed in detail herein. In addition, although digital operation is described, a CFET receiver according to the invention could also be designed to function as part of an analog circuit.

If a digital "1" is transmitted, then input beams $A_1$ and $A_2$ will be bright and will be incident on detector diodes 1 and 4 which results in a positive gate-source voltage on FET 5, and a negative gate-source voltage on FET 7. The input beams $B_1$ and $B_2$ will be dark. These inputs tend to turn on FET 5, while turning off FET 7. During this switching phase, current flows from $V_{dd}$ to $V_{ss}$ until FET 7 is off. When the digital "1" output signal at node Z is stable, no static current flows in the circuit. If a digital "0" is next transmitted, then input beams $A_1$ and $A_2$ are dark and input beams $B_1$ and $B_2$ are bright and are simultaneously incident on detector diodes 2 and 3, thus tending to turn off the FET 5 while turning on the FET 7. Once again, after the output signal at node Z is stable no static current flows. This type of switching operation results in a push-pull action of the CFET receiver 10. When operated so that the time spent in the switching phase is short, the electrical power consumption of the CFET receiver will be relatively low. Thus, a low power dissipation optical receiver circuit (comparable to a CMOS-type circuit) is realized.

In an alternative mode of operation, a digital data signal may be defined solely by the first input beam, in which case the second input beam performs the function of an externally supplied reset beam to return the CFET receiver 10 to a preset fixed state. For example, if a logic "1" is transmitted, input beams $A_1$ and $A_2$ are incident on diodes 1 and 4 causing the output signal at node Z to rise to a level representing the logic level "1". The output at node Z is then sampled, and then input beams $B_1$ and $B_2$ are incident on photo-diodes 2 and 3 to cause the signal at node Z to return to its preset level. If a logic level "0" is then transmitted, the input beams $A_1$ and $A_2$ would have no effect on the output at node Z, node Z is then sampled and the preset voltage level taken as being logic "0". Input beams $B_1$ and $B_2$ are then again incident on photo-diodes 2 and 3, but since the voltage level is already at the preset level they have no effect. Thus, in reality the input beams $B_1$ and $B_2$ only reset the CFET receiver 10 after a logic level "1" has been sampled, but are required each time the input beams $A_1$ and $A_2$ are incident on the photo-diodes in order to ensure correct operation.

When operated digitally, the CFET receiver 10 has two logical output states represented by the voltage generated at node Z. If these logic values approximate those of a logic family used to construct the FETs 5 and 7, then the output at node Z can be connected directly to a logic gate without requiring additional circuitry. Otherwise circuitry must be added to translate the output to the correct level.

Another advantage of the CFET receiver 10 is that it is insensitive to the absolute value of the power used in the first and second input beams with respect to generating output data. Prior art optical receivers typically use only one input beam, and if the power level of that beam is too low then an incorrect output signal is generated. In contrast, the present CFET receiver circuit 10 makes a decision regarding the output signal based on the difference between the first input beam and the second input signal beam. That is, if the signal on input beams $A_1$ and $A_2$ is larger than input beams $B_1$ and $B_2$, the speed of the circuit is directly proportional to the difference in power between the two beams.

Further, the specific threshold voltage of the FETs of the CFET receiver 10 is not critical to receiver operation. This is true because the CFET receiver 10 produces an output signal based on the difference in current between the upper FET 5 and the lower FET 7. Therefore, if the two FETs are identical, their specific threshold voltage will not be critical, as long as the photo-diodes are capable of turning an FET on and off.

The CFET receiver 10 of FIG. 1 can be fabricated as a monolithically integrated optically addressed circuit. A crucial step for realizing practical optical interconnections between electrical processing elements on the massively parallel scale is the monolithic integration of a controllable optical element with semiconductor microelectronics. An example of such an optical element is a p-i-n multiple quantum well (MQW) device which can be utilized as both a detector and an optical modulator. GaAs field effect transistors (FETs) have been integrated with GaAs multiple quantum well (MQW) light modulators, the combination being referred to as FET-SEEDs. Doped-channel heterojunction field-effect transistors (HFETs), also known as doped-channel MIS-like FETs (DMTs), are typically used as the GaAs electronic component.

Integration of FETs and MQW modulators provides compact arrays of amplifier circuits, high fabrication yields, and increased functionality by providing digital electronic processing between the optical input and output. Such integrated electronic circuits are sometimes called "smart pixels", and this technology is disclosed in a paper by T. K. Woodward et al., "Operation of a Fully Integrated GaAsAl$_x$Ga$_{1-x}$As FET-SEED: A Basic Optically Addressed Integrated Circuit", *IEEE Photonics Technology Letters*, Vol. 4, No. 6, June 1992, pp. 614–617. In addition, process technology suitable for flexible design and fabrication of high-yield field-effect transistor self-electro-optic-effect (FET-SEED) devices has been disclosed in a paper by L. A. D'Asaro et al., "Batch Fabrication and Structure of Integrated GaAs-Al$_x$Ga$_{1-x}$As Field-Effect Transistor-Self-Electro-optic Effect Devices (FET-SEED's)", *IEEE Electron Device Letters*, Vol. 13, No. 10, October 1992, pp. 528–531. These papers are incorporated by reference herein.

Figure 2:
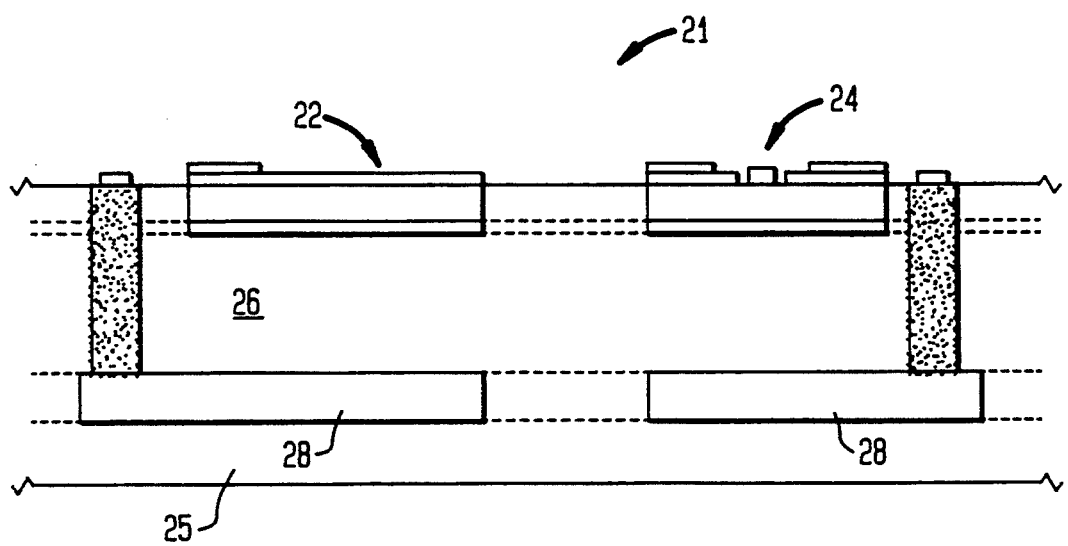
FIG. 2 is a schematic cross section of an FET-SEED structure.

FIG. 2 is a schematic cross section of the wafer structure of such an FET-SEED apparatus 21 which can be fabricated to realize the CFET receiver 10 of the present invention. A multiple-quantum-well (MQW) modulator 22 and a depletion-mode field effect transistor (DMT) 24 are shown fabricated on a semi-insulating GaAs substrate 25. The MQW modulator 22 can be used as either an optical modulator or as a photo-diode, and the DMT 24 can be used as part of an amplifier circuit to process signals from the MQW modulator. A multiple quantum well section 26 underlies the FET layers and performs both detection (at the input) and signal modulation (at the output). A p-layer 28 is present under both the DMT 24 and the MQW modulator 22 in the optoelectronic circuit and acts not only as one terminal of the modulator 22, but also as a control electrode or ground plane under the DMT 24 to protect the gate region from the effects of stray electric fields. Fabrication of such an integrated circuit relies on the extension of known buried interconnect fabrication techniques which are beyond the scope of the present invention, and thus will not be described further herein.

Figure 3:
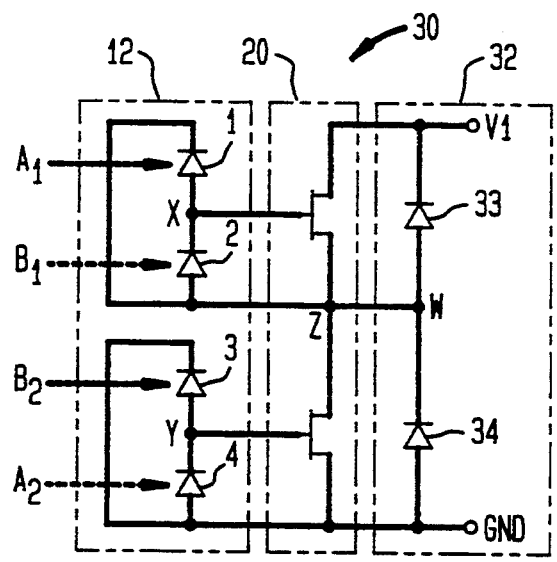
FIG. 3 is another circuit diagram of a CFET apparatus according to the present invention connected to an output stage.

FIG. 3 depicts a single-stage CFET receiver circuit 30, having an optical output section 32. Like components are numbered the same as those of FIG. 1. The optical output section 32 comprises two modulator diodes 33 and 34 connected in series having a node W connected to the electrical node Z. The modulator diodes 33 and 34 are biased between a voltage V1 and ground. The CFET receiver 30 can be realized in the FET-SEED process described in the references mentioned above, and such a monolithically integrated device can utilize a single type of field-effect transistor, e.g., either two depletion mode or two enhancement mode transistors, rather than requiring both enhancement and depletion mode devices. This is advantageous because it is simpler to fabricate devices of the same type on a semiconductor wafer.

Figure 4:
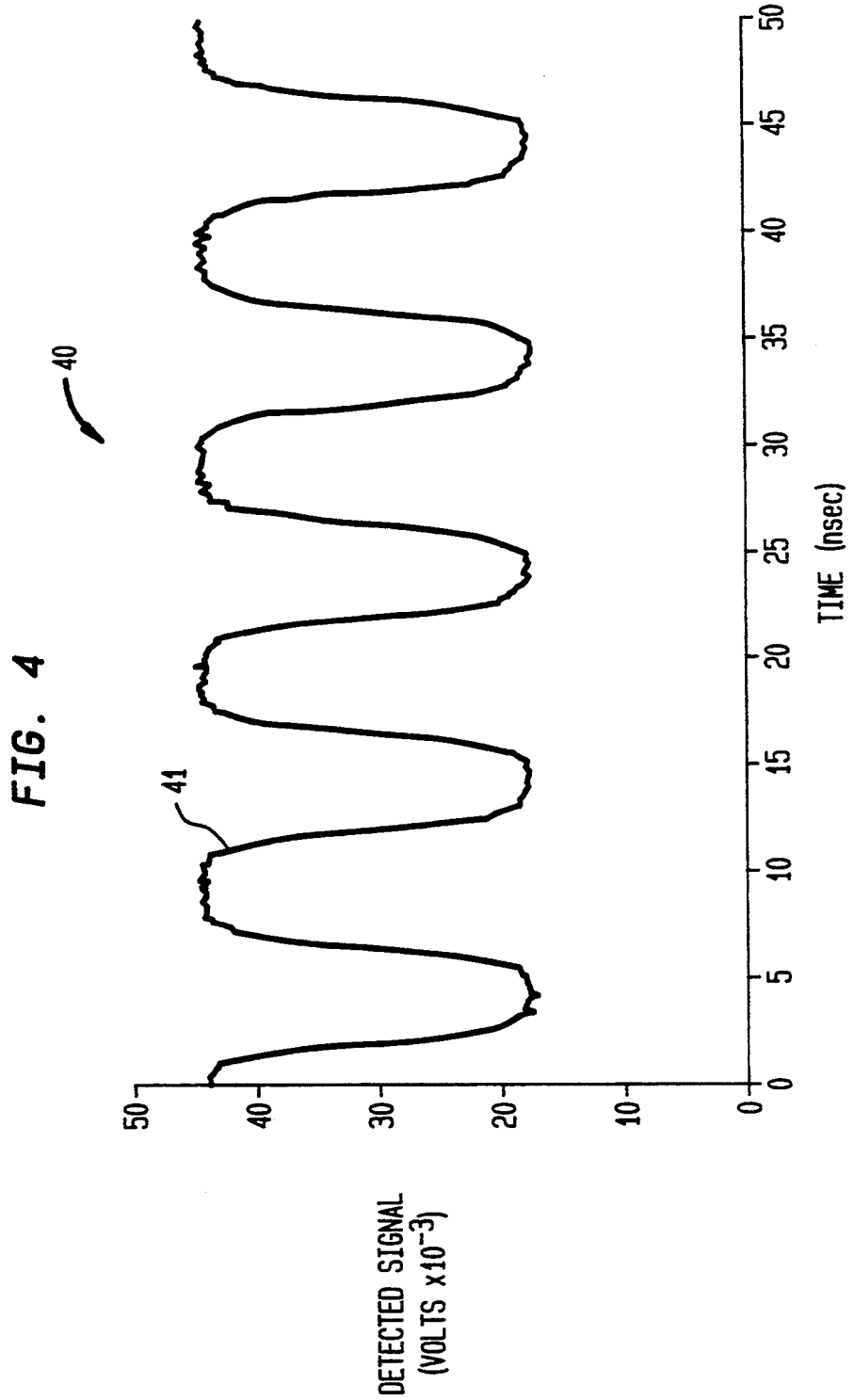
FIG. 4 graphically illustrates an output signal generated by the circuit of FIG. 3 over time.

FIG. 4 is a graph 40 of an output signal 41 taken from the output modulator 33 of FIG. 3, which illustrates the behavior of a monolithically integrated CFET receiver circuit 30. To generate the output waveform 41 of FIG. 4, a 100 Megahertz digital optical input data stream having a pattern "101010101" was incident on the four photo-diodes 1, 2, 3 and 4 of the CFET receiver 30. To acquire the output data, a light beam was reflected off the optical modulator 33. The optical modulators 33 and 34 encode a modulation on the light beams reflected off them. This modulation is then externally detected by using, for example, a photo-diode whose output is connected to an oscilloscope. Referring to FIG. 4, at time 0–1 nanoseconds (ns) a digital "1" was output, at time 3–6 ns a digital "0" was output, and so on. The difference in optical power between the pair of beams is 500 femtojoules (fJ) for one logical signal, and 600 fJ for the other logical signal. For example, for logical level "", 500 fJ of energy difference exists between the optical signals A1 and B1, and between the optical signals A2 and B2.

Figure 5:
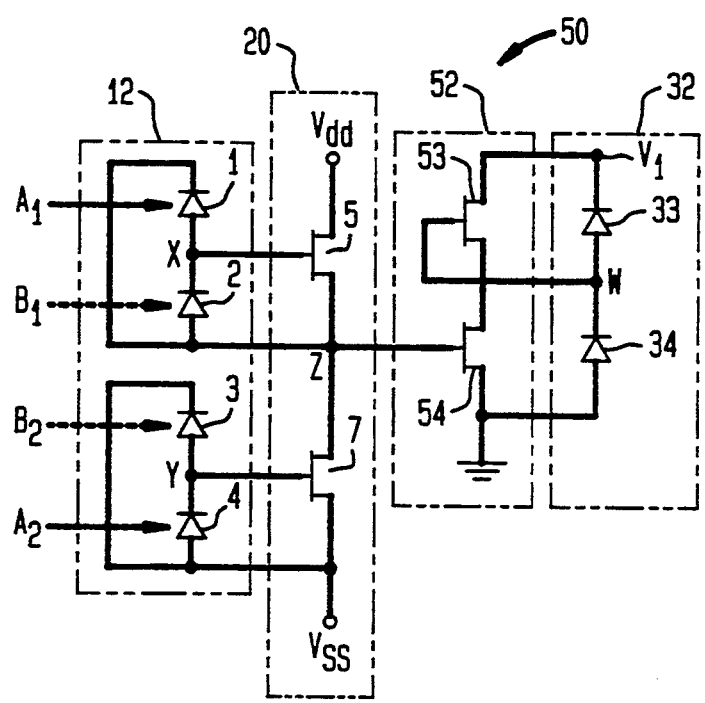
FIG. 5 is a circuit diagram of a two-stage CFET apparatus according to the present invention.

FIG. 5 illustrates a two-stage CFET receiver circuit 50 according to the present invention. An amplifier section 52 comprising FET's 53 and 54 connected in series between a predetermined reference voltage V$_1$ and ground has been added to the detection section 12, input section 20 and output section 32 shown in FIG. 3 with respect to CFET receiver 30. A monolithically integrated version of the CFET circuit 50 operates substantially in the same manner as the CFET circuit 30 of FIG. 3, except that the amplifier section 52 provides additional gain to the input signal generated at electrical node Z. Thus, it is possible to operate the CFET receiver 50 using even less optical energy than is needed to operate the CFET receiver 30.

Figure 6:
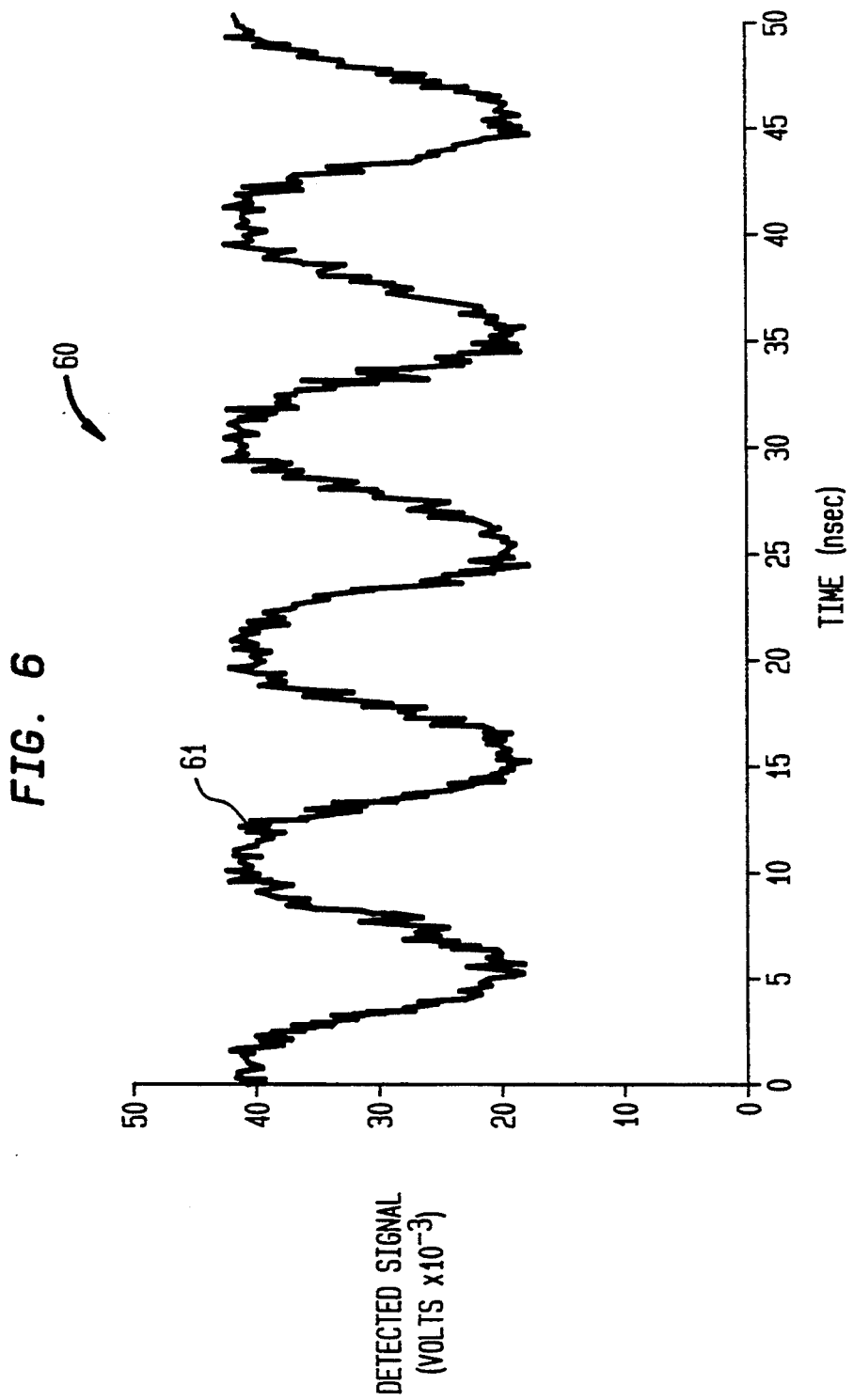
FIG. 6 graphically illustrates an output signal generated by the circuit of FIG. 5 over time.

FIG. 6 is a graph 60 illustrating the behavior of the CFET receiver 50 of FIG. 5. The same input data described above with respect to FIG. 4 was used which resulted in the output waveform 61, and the output taken from the modulator 33 in the same manner described above. The difference in energy falling on the two detector diodes of the CFET receiver 50 was about 25 fJ for one logical signal and 22 fJ for the other logical signal.

Figure 7:
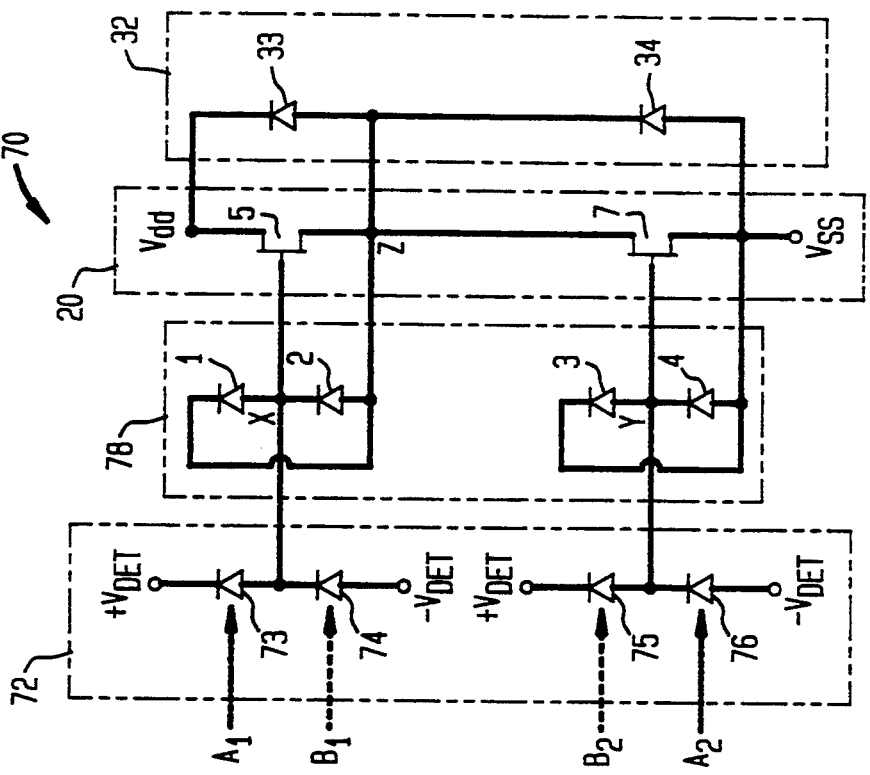
FIG. 7 is a schematic diagram of a diode-clamped CFET apparatus according to the present invention.

FIG. 7 illustrates another embodiment of a CFET receiver circuit 70 according to the present invention. The CFET receiver circuit 70 comprises a detector section 72 having photo-diodes 73, 74, 75 and 76, a clamping section 78 comprising photo-diodes 1, 2, 3 and 4, an input section 20, and an optical output section 32. The clamping diode pairs 1, 2 and 3, 4 are self-biased, have a built in voltage V$_{bi}$, and are referenced to the source of their associated transistors. Thus, the clamping circuitry 78 permits the biasing of the photo-diodes 73, 74, 75 and 76, and restricts the voltage swing at the inputs X and Y of FETs 5 and 7 to be approximately ±V$_{bi}$. The CFET receiver circuit 70 operates in substantially the same manner as the CFET receivers 30 and 50 discussed above, and the detector section 72 could also be added to the two-stage CFET circuit 50.

The above CFET receiver embodiments of FIGS. 1, 3, 5 and 7 have been fabricated utilizing FET-SEED integration technology, and their operation described with respect to the optical energies and voltages utilized with such circuitry. However, the concepts described herein can be more generally applied to any FET-based receiver technology.

It is to be understood that the above-described embodiments are merely illustrative, and that many variations can be devised by those of skill in the art without departing from the scope of the invention.

I claim:

1. A photo-receiver apparatus, comprising:
   first and second detectors connected in series in a loop having a first node between them;
   third and fourth detectors connected in series in a loop having a second node between them;
   a first field-effect transistor having a gate input connected to the first node, a drain input connected to a preset drain voltage and a source input connected to a third node; and
   a second field effect transistor having a gate input connected to the second node, a drain input connected to the third node and a source input connected to a preset source voltage;

wherein a first input signal beam is simultaneously detected by the first and fourth detectors and a second input signal beam is simultaneously detected by the second and third detectors to produce output signals at the third node.

2. The apparatus of claim 1, further comprising: first and second optical modulators connected in series and having an output node between them connected to the third node, for generating an optical output.

3. The apparatus of claim 1, further comprising: an amplifier connected to the third node.

4. The apparatus of claim 3, wherein the amplifier comprises two field-effect transistors connected in series.

5. The apparatus of claim 1, further comprising: clamping means connected to the first node for restricting the voltage at the first node.

6. The apparatus of claim 1, further comprising: clamping means connected to the second node for restricting the voltage at the second node.

7. The apparatus of claim 5, wherein the clamping means comprises two clamping diodes connected in series.

8. The apparatus of claim 6, wherein the clamping means comprises two clamping diodes connected in series and biased within a predetermined voltage range.

9. The apparatus of claim 1, wherein the photoreceiver comprises a monolithically integrated circuit.

10. The apparatus of claim 9, wherein the detectors are multiple quantum well p-i-n diodes.

11. The apparatus of claim 9, wherein the field-effect transistors are GaAs transistors.

12. The apparatus of claim 9, wherein the field-effect transistors are silicon transistors.

13. The apparatus of claim 1, wherein the detectors are photo-diodes.

14. A method for generating output signals from optical input signals utilizing a complementary field-effect transistor (FET) receiver, comprising:
    detecting a first optical input beam;
    generating a first voltage and a second voltage;
    switching a first FET on and a second FET off to generate a first output;
    detecting a second optical input beam;
    generating a third voltage and a fourth voltage; and
    switching the first FET off and the second FET on to generate a second output.

15. The method of claim 14, further comprising: generating optical output signals from the first and second outputs.

16. The method of claim 14, further comprising: amplifying the first and second outputs.

17. The method of claim 14, wherein the outputs correspond to digital logic levels.

18. The method of claim 14, wherein the complementary FET receiver produces analog outputs.

* * * * *